United States Patent [19]
Lee et al.

[11] Patent Number: 5,313,108
[45] Date of Patent: May 17, 1994

[54] CIRCUIT FOR GENERATING A STRETCHED CLOCK SIGNAL BY ONE PERIOD OR ONE-HALF PERIOD

[75] Inventors: Robert H. J. Lee, Palo Alto; John D. Kenny, Sunnyvale, both of Calif.

[73] Assignee: Picopower Technology, Inc., San Jose, Calif.

[21] Appl. No.: 870,530

[22] Filed: Apr. 17, 1992

[51] Int. Cl.⁵ .............................................. H03K 5/04
[52] U.S. Cl. .................................. 307/267; 307/269; 328/58
[58] Field of Search ...................... 307/265, 267, 269; 328/58, 63

[56] References Cited

U.S. PATENT DOCUMENTS

| | | |
|---|---|---|
| 4,105,978 | 8/1978 | Goss et al. ........................... 328/58 |
| 4,355,283 | 10/1982 | Ott ...................................... 307/265 |
| 4,636,656 | 1/1987 | Snowden et al. ................... 307/267 |
| 4,862,096 | 8/1989 | Spence .............................. 307/265 |
| 5,045,715 | 9/1991 | Fitch .................................... 328/20 |

*Primary Examiner*—William L. Sikes
*Assistant Examiner*—Toan Tran
*Attorney, Agent, or Firm*—Oblon, Spivak, McClelland, Maier & Neustadt

[57] ABSTRACT

The time a microprocessor CPU must wait for memory access is controlled to be one of two values by stretching the CPU clock signal either a first time duration or a second time duration, depending on the expected delay caused by the memory access. The clock stretching is in increments of one quarter of the CPU clock period and is done with both the leading and trailing edges of the clock pulse.

5 Claims, 4 Drawing Sheets

# CIRCUIT FOR GENERATING A STRETCHED CLOCK SIGNAL BY ONE PERIOD OR ONE-HALF PERIOD

FIELD OF THE INVENTION

This invention relates to a circuit for improving the performance and power consumption of CPUs and in particular to a circuit and a method for reducing the time a CPU must wait for slower device's access by selectively stretching the CPU clock signal.

BACKGROUND OF THE INVENTION

In many high performance microprocessor systems, the system clock speed is faster than the memory or I/O access time. The conventional way to solve this problem is to have the CPU (central processing unit) wait for the memory access by waiting an incremental number of CPU clock cycles, such as 1 clock cycle (which is commonly known as "1 wait state") or 2 clock cycles ("2 wait states"). This, however, has the undesirable effect of slowing the system's processing speed. For example, for a 33 MHz 80386 CPU, the full CPU clock cycle is 30 nanoseconds and the CPU requires a minimum of just two CPU clock cycles per CPU bus cycle, which results in a minimum CPU bus cycle time of 60 nanoseconds. If the memory access time were 65 nanoseconds, for instance, this would require that 1 wait state be inserted which would produce a 90 nanosecond CPU bus cycle. The problem with wait stating the CPU in full CPU clock cycle increments is that in a case such as that just mentioned, while the CPU only needs to be slowed down by 5 nanoseconds it traditionally is slowed down by a full 30 nanoseconds due to the limited resolution available for wait stating the CPU.

Previously disclosed circuits have used clock stretching techniques to delay CPU cycles (see U.S. Pat. No. 5,045,715 issued Sept. 3, 1991, to Fitch), but these have only been able to stretch the clock pulse by increments of the 2× clock period (which is one half the period of the CPU clock for full in-phase clock stretching with one edge). This is particularly significant in that the period of the 2× clock is typically set to the maximum feasible speed for prevailing microprocessor technology (50–80MHz), such that a finer resolution could not be achieved by simply increasing the clock speed. In addition, previous clock stretching circuits have attempted to directly stretch both the 1× and 2× clocks.

FIGS. 1 and 2 are the same as FIGS. 1 and 3 of U.S. Pat. No. 5,045,715. The circuit of FIG. 1 is a clock circuit for generating two clock signals, one (CLK) having stretched clock phases on a cycle by cycle basis, and the second (2× CLK) being a clock signal having a frequency twice the frequency of the first clock signal which is phase and edge coherent with the first clock signal, including the stretched clock pulses. Shown are two JK flip-flops, an oscillator, a logic circuit, and an exclusive OR gate.

FIG. 2 shows the various signals used and generated by the circuit of FIG. 1. Note that signal A (CPUCLK) is phase coherent with the signal IN. The signal OUT is phase coherent with the signal CPUCLK.

SUMMARY OF THE INVENTION

In order to minimize needless delay in system operation and the resulting loss of system performance using prior art clock stretching techniques, the present invention introduces a finer resolution for slowing down the CPU bus cycle than heretofore achieved. Instead of adding additional CPU clocks (wait states) to the CPU bus cycle, the present invention stretches the CPU clock period by quarter increments of the CPU clock period, with both edges of the clock pulse, regardless of being in or out of phase. In the example just mentioned this would mean that the CPU bus cycle could be only 67.5 nanoseconds as opposed to the traditional 90 nanosecond solution. The present invention stretches the clock period with a resolution of one half the 2× clock period (one quarter CPU clock). The present invention focuses on precise control of the 2× clock such that the 1× clock (i.e., the CPU clock) can be derived from the stretched 2× clock using conventional methods.

In accordance with this invention, a clock circuit is disclosed that can stretch a CPU clock cycle by a half or by a quarter CPU clock cycle. The present invention in one embodiment provides a circuit which uses the input signal and the 2× clock signal to generate a CPU clock signal for us by a microprocessor with the clock cycle duration selectable on demand. In one embodiment, the present invention minimizes the "wait" from a full CPU clock cycle to a half or quarter CPU clock cycle as needed, and also minimizes power dissipation.

This invention will be more fully understood in conjunction with the following detailed description taken together with the drawings.

DETAILED DESCRIPTION OF THE PRESENT INVENTION

Figure 1:
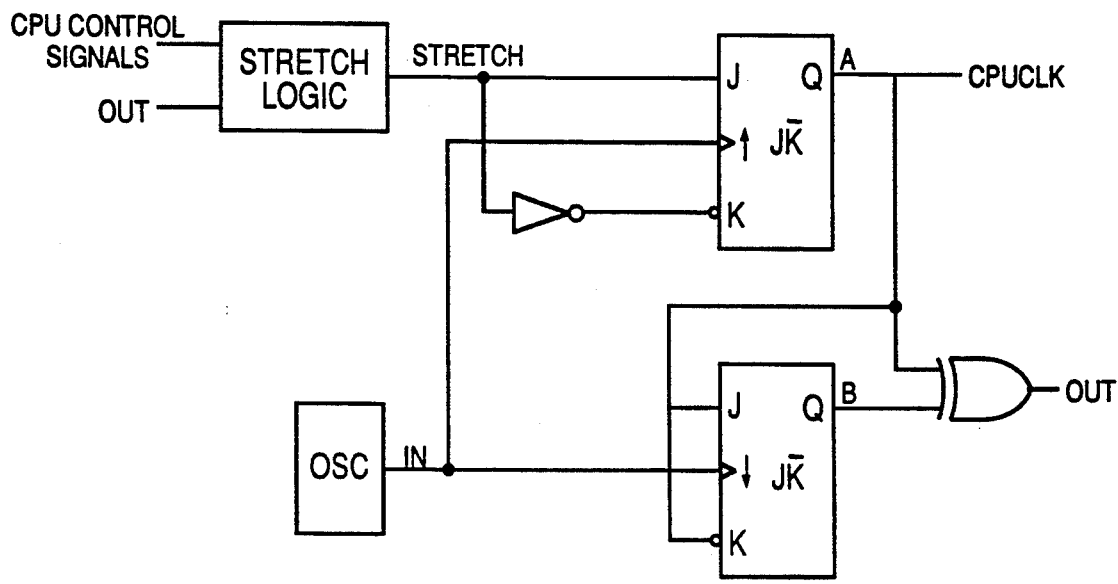
FIG. 1 is a circuit diagram of a circuit from U.S. Pat. No. 5,045,715.
Figure 2:
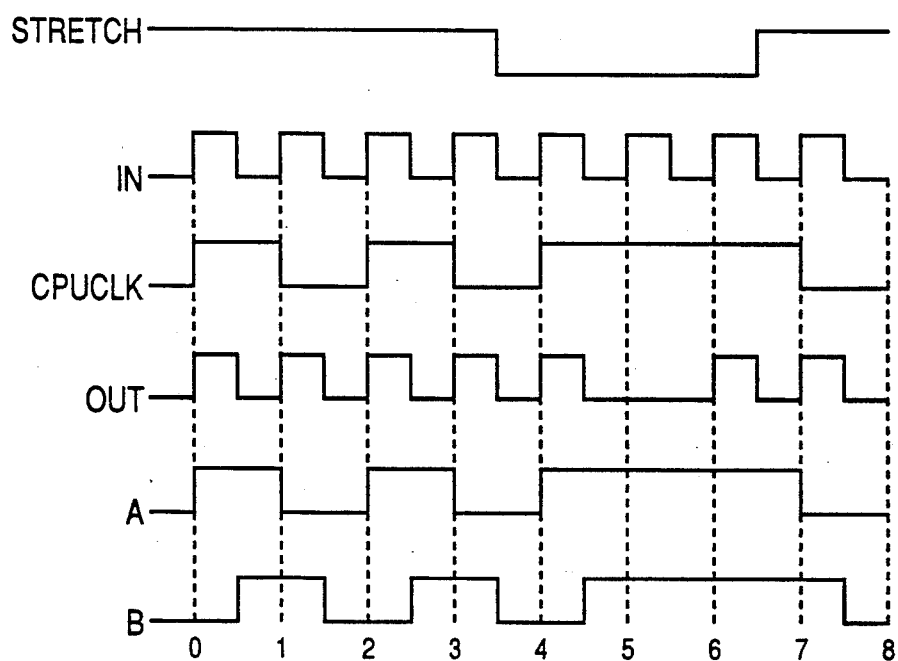
FIG. 2 illustrates timing diagrams for the circuit of FIG. 1.
Figure 3:
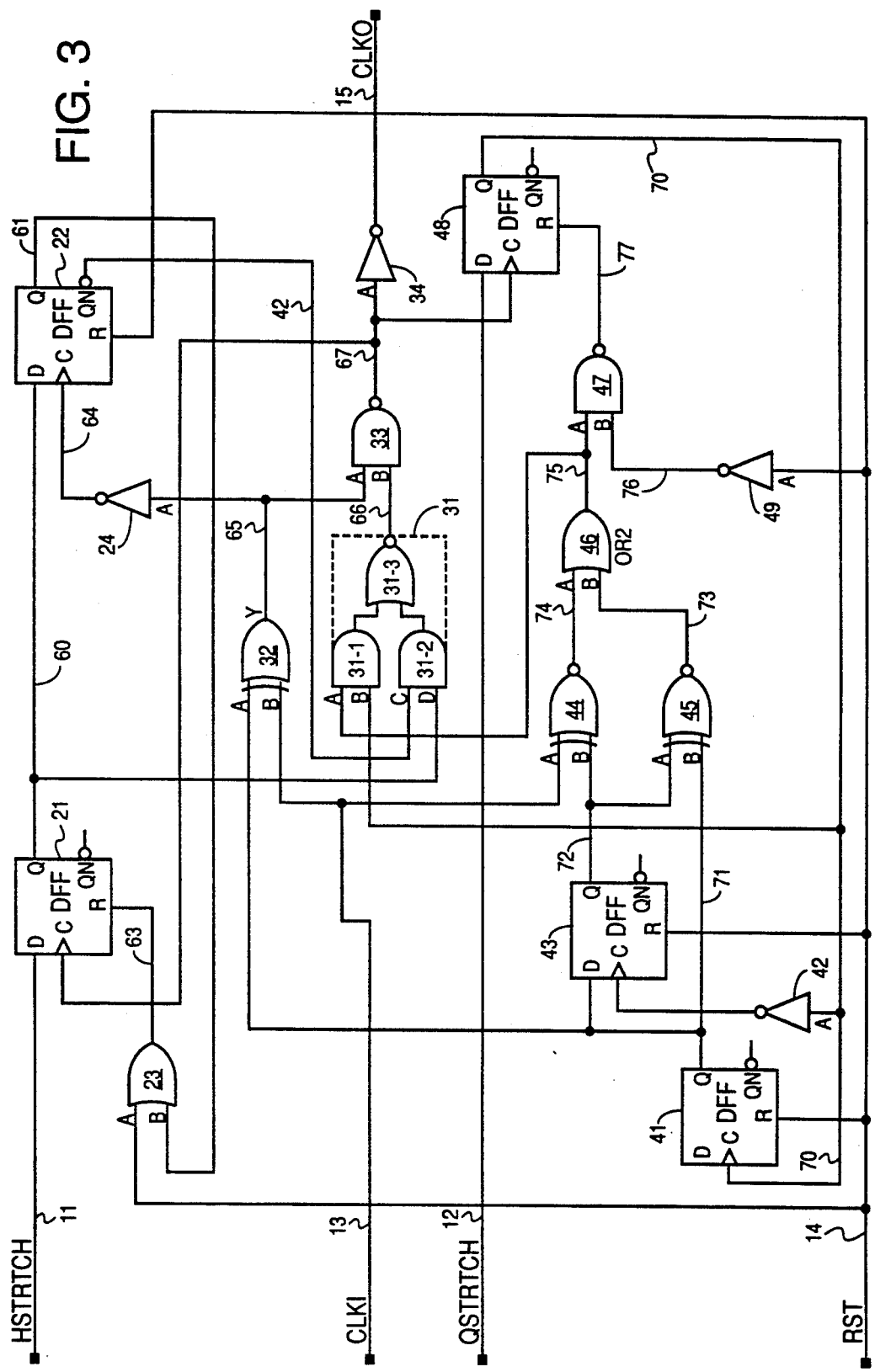
FIG. 3 is a circuit diagram of one embodiment of a circuit in accordance with the present invention.

FIG. 3 shows a pulse stretching circuit in accordance with this invention using four input control signals: QSTRTCH on input lead 12, HSTRTCH on input lead 11, CLKI on input lead 13, and RST on input lead 14, and one output signal CLKO on output lead 15. The signal CLKI on input lead 13 is the input clock for the stretch circuit; the frequency of CLKI is equal to twice the frequency of the CPU clock. The signal RST on input lead 14 is the reset signal. When RST, which is normally low, goes high, such as at power on, D-type flip-flops 21, 22, 41, 43 and 48 are reset so that the output signal or the "Q" output lead of each flip-flop is zero. The input signals QSTRTCH 12 and HSTRTCH 11 select the quarter clock stretch (¼ the CPU clock period) and half clock stretch (½ the CPU clock period) options respectively. The output signal CLKO on output lead 15 is used to drive the CPU's CLK2 input (not shown in the Figures); the frequency of CLKO is equal to twice the frequency of the CPU clock signal.

Figure 4:
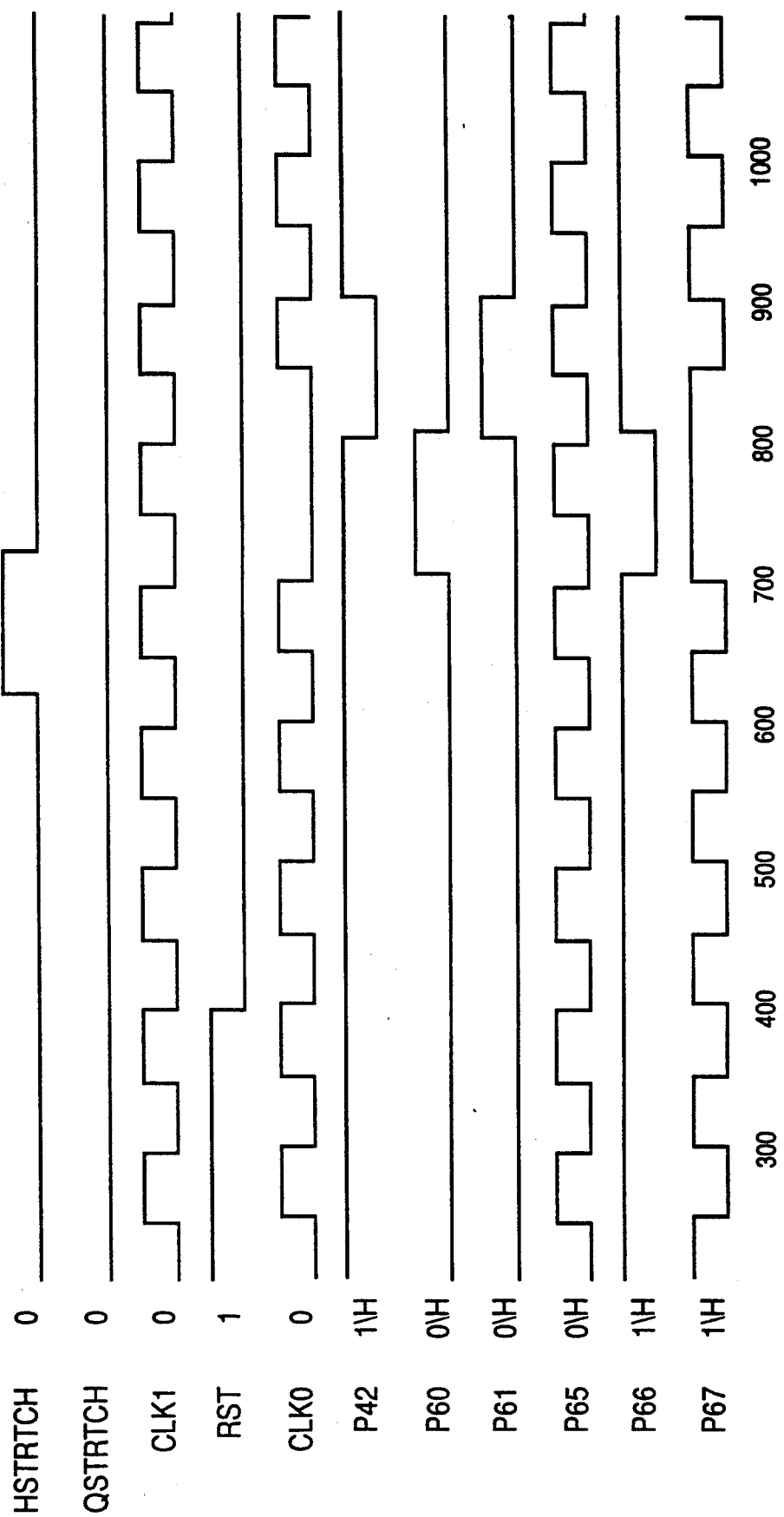
FIG. 4 illustrates timing diagrams which show relative timings of various signals generated by the circuit of FIG. 3 for a half cycle pulse stretch.
Figure 5:
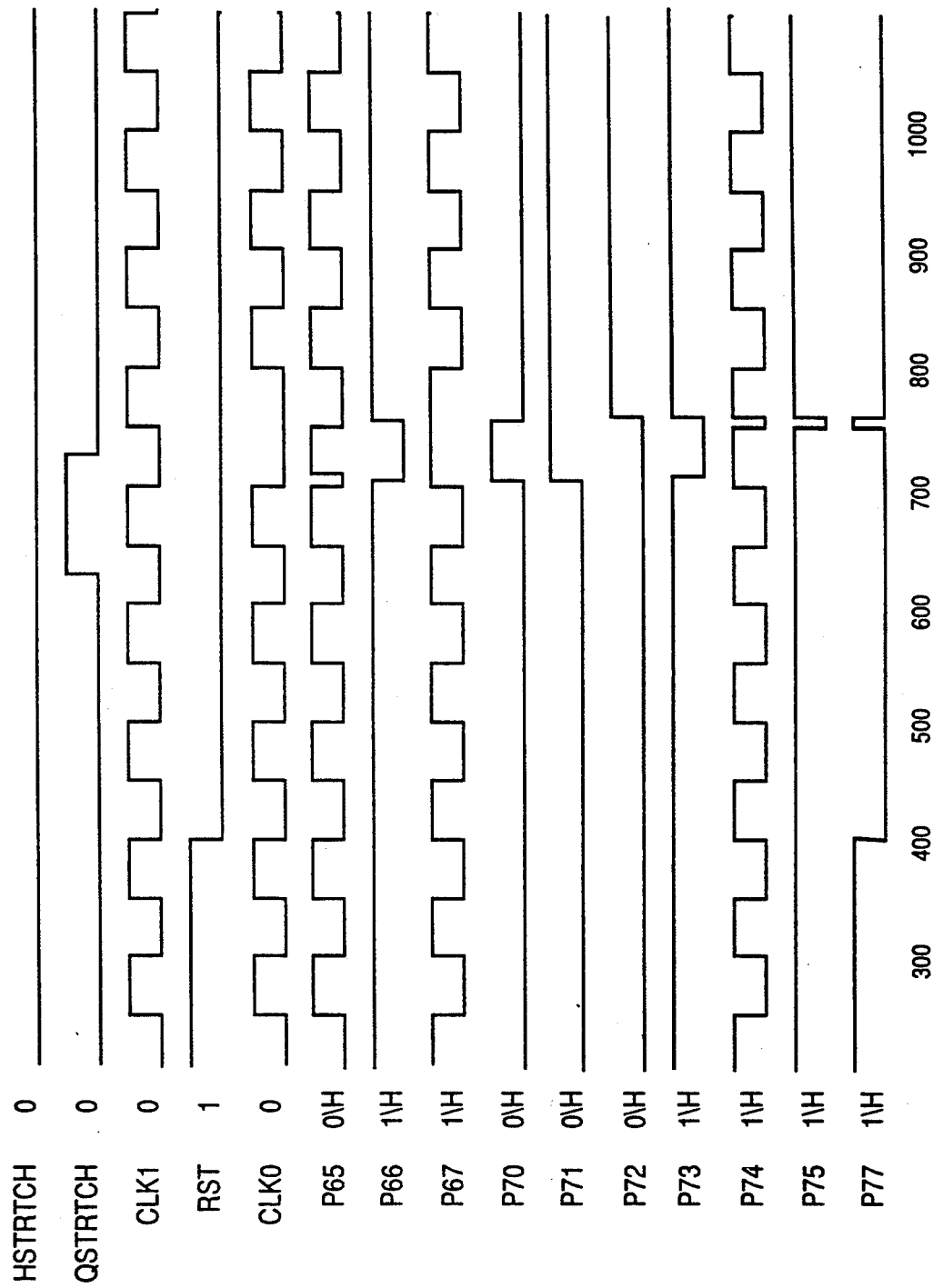
FIG. 5 illustrates timing diagrams which show relative timings of various signals generated by the circuit of FIG. 3 for a quarter cycle pulse stretch.

When signals QSTRTCH on lead 12 and HSTRTCH on lead 11 are both low, the output signal on output lead 66 of device 31 is always high, and the output clock signal CLKO on output lead 15 will be equal in frequency and period to the input signal CLKI on input lead 13 though it may be in or out of phase (see FIGS. 4 and 5).

When signal QSTRTCH on input lead 12 (FIG. 3) is high, the low portion of CLKO on output lead 15 will be extended by a quarter CPU clock cycle (half the CLKI period) relative to the CLKI signal on input lead 13. This is accomplished by waiting until the next low transition of the output signal, CLKO, then clamping the output temporarily low while a replica of the input clock signal, CLKI, is inverted by exclusive OR gate 32 on lead 65; then when the inverted clock signal on lead 65 returns low again, the output clamp is released. Devices 41, 42, 43, 44, 45, 46, 47, and 48 generate the quarter clock stretch enable signal.

When the signal HSTRTCH on input lead 11 is high, the CLKO signal on output lead 15 will be extended by half a CPU cycle (one CLKI period) relative to the CLKI signal on input lead 13 as shown in FIG. 4. This is accomplished by clamping the output signal CLKO low for the duration of one positive clock pulse of the input clock, CLKI on lead 13. Flip-flops 21 and 22, OR gate 23 and inverter 24 are used to generate the half clock stretch enable. Devices 31, 32, 33, 34 control the output clock signal CLKO.

Turning to FIG. 3, clock signal CLKI on input lead 13 is transmitted to the B input lead of exclusive OR gate 32. The signal on the A input lead to exclusive OR gate 32 is derived from the Q output lead from flip-flop 4 which is normally low. Accordingly, the output signal on lead 65 from exclusive OR gate 32 is passed to the A input lead of NAND gate 33 (the B input lead carries a normally high enabling signal on lead 66 from NOR gate 31-3). The output signal on lead 67 from NAND gate 33 is passed through and inverted by inverter 34 to become the output clock signal CLKO on output lead 15.

Thus, in normal operation the output clock signal CLKO on output lead 15 is a replica of the input clock signal CLKI on input lead 13 though they may be in or out of phase. (See the "CLKI" and "CLKO" waveforms in FIGS. 4 and 5).

Should the signal HSTRTCH on input lead 11 go high, the CPU is instructing the clock circuit to produce a half cycle stretch (i.e., a stretch in the clock signal equal to one-half of the CPU bus period or one full period of CLKI). The high level signal HSTRTCH on input lead 11 (which goes high synchronously with input clock signal CLKI) is transmitted to the D input lead of D flip-flop 21. D flip-flop 21 is then triggered by a clock signal derived from the positive going edge of the clock signal on output lead 67 from NAND gate 33. This signal is essentially the complement of the signal CLKI on input lead 13 (see FIG. 4, waveform "P67"). Accordingly, when HSTRTCH goes high, the signal on the output lead 60 on the Q terminal of flip-flop 21 is driven high at the next negative going edge of the signal CLKI. (See waveforms "CLKI" and "P60" in FIG. 4.) This high signal on lead 60 is then transmitted both to the D input lead of AND gate 31-2 thereby enabling AND gate 31-2 and to the D input lead of D flip-flop 22.

The output signal on output lead 61 of D flip-flop 22 is then clocked high (see the waveform "P61" in FIG. 4) by the next negative going edge of the next pulse of signal CLKI on input lead 13 transmitted on the B input lead of exclusive OR gate 32 and then on output lead 65 from exclusive OR gate 32 through inverter 24 to the clocking input of D flip-flop 22 (See also waveform "P65" in FIG. 4). Inverter 24 produces on output lead 64 a complement of the signal CLKI. Thus, the high output signal on the Q output lead 61 of flip-flop 22 is delayed by the period of the signal CLKI from the high output signal on the Q output lead 60 of flip-flop 21. This high-going output signal on lead 61 is then transmitted to the B input lead of OR gate 23 and used, on lead 63, to reset D flip-flop 21. Thus, the high output signal on the Q output lead from flip-flop 21 is driven low after one period of the input signal CLKI.

The output signal on output lead 65 from exclusive OR gate 32 is also transmitted to the A input lead of NAND gate 33. The signal on lead 42 connected to the Q output lead from flip-flop 22 is normally high and is just the complement of the signal on lead 61. Lead 42 is connected to the C input lead of AND gate 31-2. When the signal on lead 60 applied to input lead C of AND gate 31-2 goes high, the output signal from NOR gate 31-3 goes low, thus disabling NAND gate 33 and forcing the output signal on lead 67 high. Because the B input lead of NAND gate 33 is held low for so long as the signal on the Q output lead from flip-flop 21 is high, the output signal on lead 67 is held high for so long as the signal on the Q output lead from flip-flop 21 is high (see FIG. 4, waveforms "P60" and "P67"). This high level signal remains on lead 67 of NAND gate 33 until the Q and $\overline{Q}$ (QN) output leads from flip-flop 22 switch state in response to the signal on lead 64 being driven high through inverter 24 by the signal on lead 65 going low in response to the input clocking signal CLKI going low on the next cycle of CLKI. As a result, the $\overline{Q}$ (QN) output lead from flip-flop 22 goes low thereby driving the output signal on output lead 66 from NOR gate 31-3 high, enabling the low level clock signal CLKI on output lead 65 from exclusive OR gate 32 to be transmitted through NAND gate 33 on the A input lead thereby driving and maintaining the signal on output lead 67 from NAND gate 33 high for another half cycle of the CLKI signal. When CLKI goes high in the next half cycle, the output signal on lead 67 from NAND gate 33 goes low and the output signal CLKO goes high. Thus the pulse of output signal CLKO in FIG. 4 has been stretched by one-half the period of the CPU clock or by one period of the CLKI signal.

On the other hand, when the signal QSTRTCH goes high (which is synchronized with the phase of the clock signal CLKO) then a different portion of the circuit is activated. The driving of QSTRTCH on input lead 12 high (see FIGS. 3 and 5) causes the Q output signal on lead 70 from flip-flop 48 to go high on the next positive-going transition of the signal on lead 67. (See waveforms "QSTRTCH" and "P67" in FIG. 5 which show QSTRTCH going high between times "600" and "700" on the time scale).

The signal on lead 67 goes high on the next negative going pulse of CLKI following QSTRTCH going high. D flip-flop 48 is thus driven such that the output signal on Q output lead 70 from D flip-flop 48 goes high (see waveform "P70" in FIG. 5). The low to high transition of the signal on lead 70 clocks flip-flop 41 such that the signal on the Q output lead 71 from flip-flop 41 also goes high (see waveform "P71" in FIG. 5). This high level signal on lead 71 is applied to the D input lead of D flip-flop 43 and also to the A input lead of exclusive OR gate 32 thereby inverting the phase of the output signal on lead 65 from exclusive OR gate 32 (see waveform "P65" in FIG. 5). The high level signal on the Q output lead 71 from flip-flop 41 is also transmitted to the B input lead of exclusive NOR gate 45. The input signal on the A input lead to exclusive NOR gate 45 is low level, being the signal on the Q output lead 72 from flip-flop 43 which is low level (see waveform "P72" in FIG. 5). Accordingly, the output signal from the exclusive NOR gate 45 is driven from high (when the signals on both input leads A and B are low) to low, reflecting the input signal on input lead B of NOR 45 going high (see waveform "P73" in FIG. 5). This low level output signal is transmitted to the B input lead of OR gate 46. The A input lead of OR gate 46 is driven by the output signal on lead 74 from exclusive NOR gate 44 (see waveform "P74" in FIG. 5). The A input lead to exclusive NOR gate 44 is connected to input lead 13 carrying the input clock signal CLKI. When the B input lead of exclusive NOR gate 44 is low level, the exclusive NOR gate 44 produces an output signal on output lead 74 which is the complement of the input signal CLKI on lead 13.

When, however, the input signal on the B input lead to exclusive NOR gate 44 is driven high, the output signal on lead 74 from exclusive NOR gate 44 will be a replica of the input signal CLKI on the A input lead to exclusive NOR gate 44. (See waveforms "CLKI" and "P74" in FIG. 5).

The low level output signal on output lead 73 from exclusive NOR gate 45 is passed through OR gate 46 to output lead 75 which is connected to the A input lead of NAND gate 47. The output signal on output lead 75 is also affected by the state of the signal on the input lead A (lead 74) to OR gate 46. Because this signal is the complement of the CLKI signal on input lead 13, when the signal on lead 70 from flip-flop 48 is driven high by the negative going pulse of the CLKI signal on input lead 13, lead 75 is maintained high by the complement of the signal CLKI on lead 74.

The B input lead of NAND gate 47 is driven by the output signal from inverter 49, the input signal to which is the normally low level signal RST on input lead 14. The signal RST is used to reset the circuit, for example during power up. Accordingly, the input signal on lead 76 to input lead B of NAND gate 47 is normally high, thereby enabling NAND gate 47. The high level signal on output lead 75 is transmitted to the A input lead of AND gate 31-1 as well as through NAND gate 47 to appear as a low level signal on the output lead 77 from NAND gate 47.

Upon the next positive going pulse of the input signal CLKI (between the times 700 and 800 in FIG. 5), the signal on lead 74 from exclusive NOR gate 44 goes low, thereby driving the signal on output lead 77 from NAND gate 47 high and resetting flip-flop 48. Accordingly, the signal on lead 70 goes low at this time (see waveform "P70" in FIG. 5) thereby causing the output signal from inverter 42 which clocks flip-flop 43 to go high thereby clocking the signal on the Q output lead 72 from flip-flop 43 to a high level. See waveform "P72" in FIG. 5 where this low to high transition is shown. This transition causes the exclusive NOR gate 44 to have a high input signal on its B input lead and exclusive NOR gate 45 to have a high input signal on its A input lead.

A high input signal on the B input lead to exclusive NOR gate 44 causes the output signal on output lead 74 from exclusive NOR gate 44 to be a replica of the input signal CLKI on input lead 13. See waveform "P74" in FIG. 5. Accordingly, the high level (for ½ period of CLKI) output signal on lead 74 is passed through OR gate 46 to output lead 75 and to both A input lead of AND gate 31-1 and the A input lead of NAND gate 47. However, because the signal on lead 70, connected to the B input lead of AND gate 31-1 is now low level, the output signal from AND gate 31-1 goes to a low level and drives NOR gate 31-3 to produce a high level output signal on output lead 66. This high level output signal is transmitted through NAND gate 33. The other input lead to NAND gate 33 is driven by the output signal on lead 65 from exclusive OR gate 32. The input signal on the B input lead to exclusive OR gate 32 is just the clock signal CLKI on lead 13. The A input lead of exclusive OR gate 32 is still the high level signal from the Q output lead 71 of flip-flop 41. Accordingly, the output signal from exclusive OR gate 32 on lead 65 is the complement of CLKI signal 13. Accordingly, when CLKI 13 goes high, the output signal on lead 65 goes low. The high output signal on input lead B of NAND gate 33 connected to output lead 66 from NOR gate 31-3 causes the NAND gate 33 to produce an output signal which is the complement of the output signal on output lead 65 from exclusive OR gate 32. This output signal is then inverted by inverter 34 and becomes the output signal CLKO on lead 15. However, the result of the above logical operations is to stretch the pulse of the output signal CLKO on output lead 15 by one-half the period of CLKI or by one quarter the CPU bus cycle.

Both QSTRTCH and HSTRTCH are programmed to stay high only for one period of CLKI, the input clock signal. Should a second QSTRTCH pulse follow the QSTRTCH pulse shown in FIG. 5, the circuit of FIG. 3 will operate in essentially the manner as described above except that the signal on lead 71 from the Q output lead of flip-flop 41 is driven low by the signal on lead 70 going from low to high. The low signal on the A input lead to exclusive OR gate 32 causes exclusive OR gate 32 to produce on output lead 65 a replica of the input clock signal CLKI on input lead 13.

Should the HSTRTCH signal follow the QSTRTCH signal, then the circuit of FIG. 3 works as described above to stretch the output clock signal CLKO on lead 15 by the period of the input clock signal CLKI. Naturally, by increasing the frequency of the input clock signal CLKI, the CPU time delays associated with memory access or the waiting to receive data or instructions can be more finely quantized and thus more closely matched to the actual access or wait.

While one embodiment of this invention has been described above, other embodiments of this invention will be obvious in view of the above description and these other embodiments are intended to be covered by the claims.

We claim:

1. An apparatus for producing variable clock output signals for digital circuits comprising:
   inputting means for accepting as in input signal a clock signal of a given frequency;
   outputting means for outputting a clock signal which is identical to said input clock signal;
   first and second input control means for accepting first and second input control signals respectively; and
   control means having
   a first output stretching means coupled to said first input control means and said inputting means for outputting a clock signal stretched by one period of the inputted clock signal in response to a signal being present at said direst input control means; and second output stretching means coupled to said second input control means and said inputting means for outputting a clock signal stretched by one-half of the period of the inputted clock signal in response to a signal being present at said second input control means.

2. An apparatus as in claim 1 wherein said first output stretching means comprising:
  delaying means for outputting a signal wherein the time between two consecutive pulses of the outputted clock signal is extended by a time equal to one period of the inputted clock signal.

3. An apparatus as in claim 1 wherein said second output stretching means comprising:
  delaying means for producing a clock signal which is delayed from the inputted clock signal so that the time between two consecutive pulses of the outputted clock signal are extended by a time equal to one-half a period of the input clock signal.

4. An apparatus as in claim 2 wherein said means for delaying comprises:
  means for preventing passage of one pulse from said inputted clock signal said outputted clock signal.

5. An apparatus as in claim 3 wherein said means for delaying comprises:
  means for inverting said input clock signal.

* * * * *